United States Patent [19]

Humenik et al.

[11] Patent Number: 6,045,714
[45] Date of Patent: Apr. 4, 2000

[54] METHOD FOR FORMING FLAT SURFACE VIAS IN INTEGRATED CIRCUIT SUBSTRATES

[75] Inventors: James N. Humenik, Lagrangeville; Keith C. O'Neil, Hughsonville, both of N.Y.

[73] Assignee: International Business Machines Corporation, Armonk, N.Y.

[21] Appl. No.: 09/053,318

[22] Filed: Apr. 1, 1998

[51] Int. Cl.[7] .................................................. H01B 13/00
[52] U.S. Cl. .............................................. 216/17; 216/18
[58] Field of Search ........................................ 216/17, 18

[56] References Cited

U.S. PATENT DOCUMENTS

| | | | |
|---|---|---|---|
| 4,808,435 | 2/1989 | Cropp et al. | 427/97 |
| 4,990,080 | 2/1991 | Kakimoto | 425/290 |
| 5,145,551 | 9/1992 | Booke et al. | 156/626 |
| 5,171,964 | 12/1992 | Booke et al. | 219/121.19 |
| 5,271,150 | 12/1993 | Inasaka | 29/852 |
| 5,466,330 | 11/1995 | Sakai et al. | 156/584 |
| 5,573,620 | 11/1996 | Sakai et al. | 156/249 |
| 5,578,151 | 11/1996 | Andris et al. | 156/64 |
| 5,698,015 | 12/1997 | Mohri et al. | 106/1.13 |
| 5,922,245 | 7/1999 | Morhi et al. | 252/512 |

*Primary Examiner*—Benjamin L. Utech
*Assistant Examiner*—Charlotte A. Brown
*Attorney, Agent, or Firm*—Ratner & Prestia; Tiffany L. Townsend

[57] ABSTRACT

Conductive vias in integrated circuit ceramic greensheets are formed with essentially flat exposed surfaces by applying an adherent in situ mask material to the greensheet prior to punching via openings therethrough. The in situ mask material then serves to permit the application of a second overprint conductive paste after the original conductive paste has filled the via opening and formed a depression upon hardening. The second overprint paste fills the depression and leaves an essentially flat top surface. When the in-situ mask material is removed, a slight protuberance of conductive paste remains in a plane vacated by the in-situ mask material (with or without the second conductive paste application). In one form of the invention, this protuberance is compressed back so that it is essentially level with the surrounding ceramic greensheet by the application of pressure thereto, either by a platen or by an adjoining greensheet lamina.

10 Claims, 2 Drawing Sheets

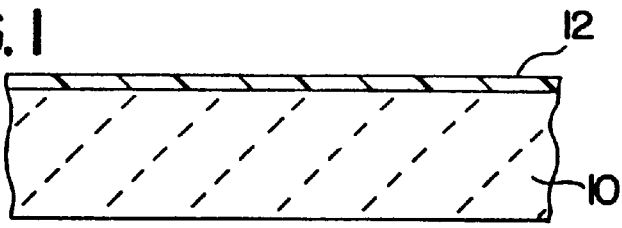
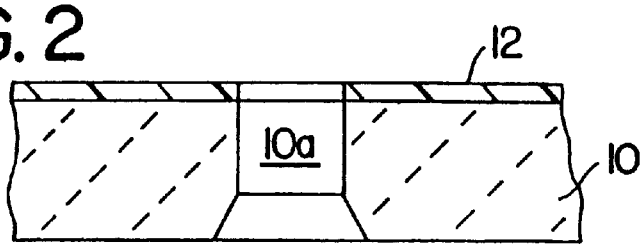
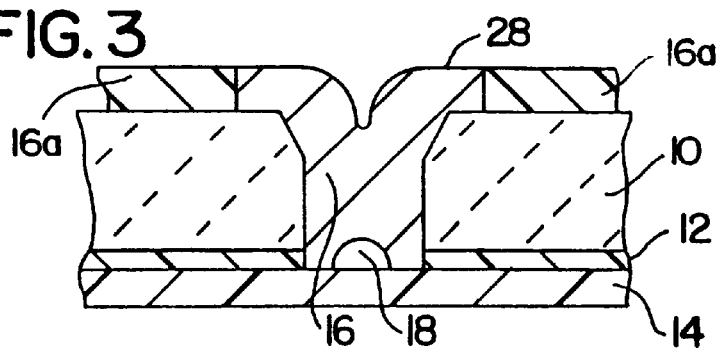
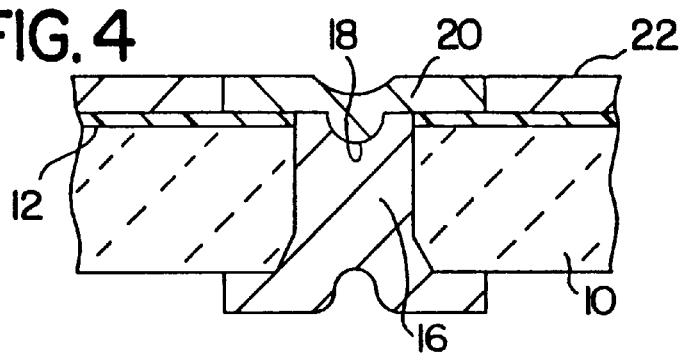
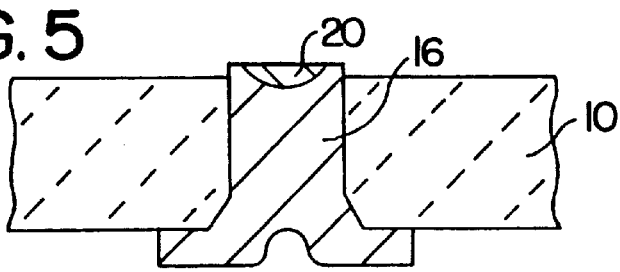

METHOD FOR FORMING FLAT SURFACE VIAS IN INTEGRATED CIRCUIT SUBSTRATES

FIELD OF THE INVENTION

The present invention pertains to a method for forming conductive vias in a surrounding greensheet integrated circuit substrate, wherein protuberances and depressions in the exposed surfaces of the vias are minimized.

BACKGROUND OF THE INVENTION

Integrated circuits are commonly made incorporating as the substrate thereof a thin sheet material referred to as ceramic greensheet or just greensheet. Conductive patterns may be screened onto one or both surfaces of such ceramic greensheets and conductive passageways therethrough, known as vias, are formed by punching holes in the greensheet and filling the holes with conductive paste which hardens into an electrical conductor. This serves to connect conductive elements on the two sides of the greensheet or to conductive elements on adjacent greensheets or to soldered connections.

Because of the extremely small size of such integrated circuits, surface imperfections in the conductive vias may cause problems in the subsequent connection or assembly of the substrate. Depressions in a surface via, for example, may entrap flux during chip joining such that outgassing occurs and forms voids in a solder joint at the depression-including surface of the via. Such voids can be detrimental to the performance, reliability, or both performance and reliability of the joint. Similarly, a via protuberance, above the surrounding surface of the ceramic greensheet, may cause a corresponding surface imperfection in a conductive element screened over, and making electrical connection with, this via surface.

Conventional attempts to minimize protuberances and depressions in the exposed surfaces of the conductive vias formed in a surrounding greensheet integrated circuit substrate have not been entirely successful. A need exists, therefore, for an improved method for forming conductive vias in a surrounding greensheet integrated circuit substrate wherein protuberances and depressions in the exposed surfaces of the vias are minimized. Accordingly, forming conductive vias in a ceramic greensheet, while minimizing depressions and protuberances in the exposed surface of the conductive via, is a common object.

SUMMARY OF THE INVENTION

To achieve this and other objects, and in view of its purposes, the present invention provides a method for forming conductive vias in ceramic greensheet while minimizing depressions in the exposed surface of the conductive via. Attached to the greensheet is an in situ mask material on one side thereof. Via openings are punched through both the ceramic greensheet and through the adhered mask material.

Thereafter, a conductive paste is forced into the via opening, such as by screening using the in-situ mask material as a mask. As the conductive paste hardens (or shortly thereafter), the in-situ mask may be removed. If a slight protuberance, which lies in a plane vacated by the mask material, remains, it may be flattened (or planarized) to the level of the surrounding greensheet, either through the application of pressure by platens on opposite sides of the greensheet, or by lamination of the greensheet into a multilayer greensheet assembly. In either case, a substantially flat via surface is exposed for conductive mating to connecting elements or circuitry elements on an adjoining lamina.

Particularly when a more fluid conductive paste is used for screening, as the conductive paste hardens, it contracts slightly. This leaves a slight depression at the exposed via surface, which may be the source of conductivity faults with connection elements, such a solder joint at the exposed via surface. Such imperfections may also be precluded in accordance with the present invention. Again using the punched via hole in the mask material as a mask, additional conductive paste material is applied to the exposed surface containing such a depression. As this additional conductive paste material hardens, it is essentially flat with the surrounding surface of the in situ mask material due to the fact that the smaller mass of conductive paste in the second application does not contract as much as the original conductive paste via filler. This is due to the relatively smaller amount of solvent to be given off by the second conductive paste application and by the fact that solvent in this second conductive paste application escapes primarily through the exposed via surface and not into the surrounding greensheet (as does much of the solvent in the original conductive paste via filler). As this additional conductive paste dries, preferably before it hardens, the in situ mask material may then be removed to leave an essentially flat exposed surface.

To minimize the amount of conductive paste used in the second application, a second mask, slightly larger than the in situ mask, may be used with an opening surrounding that of the in situ mask via opening. The second conductive paste is applied through the second mask which is then removed as the paste hardens and prior to the removal of the underlying in situ mask material.

It is to be understood that both the foregoing general description and the following detailed description are exemplary, but are not restrictive, of the invention.

DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 1 through 6 illustrate the sequential stages in which a conductive via is formed in a ceramic greensheet integrated circuit substrate and subsequently treated to facilitate conductive contact therewith, wherein a second conductive paste application is made to minimize surface depressions. More specifically, FIG. 1 depicts a greensheet to which is adhered an in situ mask material;

FIG. 2 depicts the greensheet and in situ mask material with a via opening punched therein;

FIG. 3 depicts the initial formation of conductive paste in the via opening;

FIG. 4 depicts the application of overprint paste through the mask material;

FIG. 5 shows the remaining flat exposed surface via formed upon removal of the mask; and FIG. 6 depicts the embodiments of the invention wherein a conductive paste protuberance at an exposed via surface is flattened.

DESCRIPTION OF THE INVENTION

Figure 6:
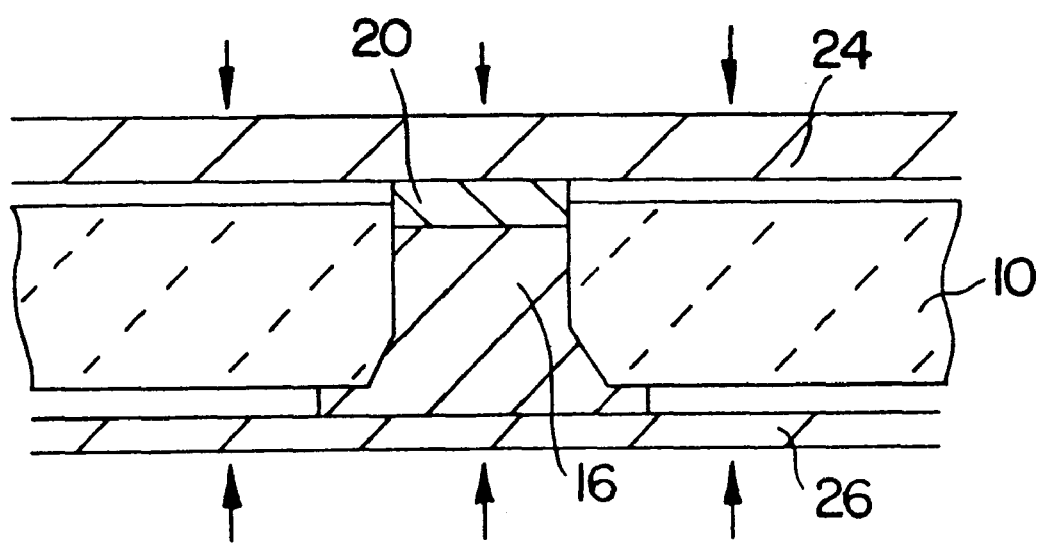

With reference to the figures, the present invention comprises a method in which a ceramic greensheet material 10, of the type commonly used for forming integrated circuit substrates, is covered by an in situ mask material 12, such as a thin plastic sheet, typically on the order of 0.025–0.13 mm (1–5 mils) thick. Such a ceramic greensheet is typically formed of alumina or glass or aluminum nitride particles on the order of 3–5 microns in diameter, a binder material, a plasticizer, and a solvent. A slurry of the ceramic particles is spread over a flat surface to form a sheet on the order of 0.025–0.625 mm (1–25 mils) thick, more commonly on the order of 0.05–0.275 mm (2–11 mils). Chemical adhesives, electrostatic attraction and magnetic attraction are among ways in which an in situ mask 12 may be applied to a greensheet material 10.

Circuit lines are formed on this greensheet, typically by metal deposition through a pattern resist on a mesh screen, or through a patterned metal mask, through which a conductive paste is screened to form the circuit pattern in the X-Y direction of the greensheet. As many as one hundred or more of these greensheets, with circuitry formed thereon, may be laminated to form a single electronic component. The circuitry in the various layers of the laminate is interconnected and also connected to external leads through conductive "vias," i.e., holes punched through individual greensheets and filled with a conductive paste. As many as 80,000 such vias may be present in each greensheet.

The conductive paste filling these vias typically comprises a composition formed primarily of metal particles, such as molybdenum, tungsten, copper, or silver, or combinations thereof, sometimes combined with a ceramic filler material, such as glass or aluminum oxide particles or a combination thereof, all disposed in a suitable solvent vehicle such as butyl carbitol acetate, and an organic binder such as ethylcellulose. Necessarily, this conductive paste composition has a low enough viscosity to permit its screening and filling of the spaces of the vias, typically on the order of 0.05 to 0.5 mm (5 to 50 mils), more commonly 2 to 20 mils in diameter. Thus, the solvent and vehicle in the paste occupy a significant amount of the volume of the composition, which is removed as the paste is dried. It is this drying action which forms the depressions, the avoidance of which is a primary object of the present invention.

As shown in FIG. 2, to form a via in a greensheet, as seen in FIG. 1, a hole or via opening 10a is punched therethrough. In accordance with the present invention, each such hole 10a is punched both through the greensheet 10 and through the in-situ mask 12. Then, as shown in FIG. 3, a backing member 14 is applied to cover the exposed surface of the via on the in-situ mask side and conductive paste 16 is pressed into and fills the conductive via from the opposite side of the greensheet, through a filler mask 16a. Alternatively, the conductive paste may also be applied to the via opening from the in-situ mask side thereof, using the in-situ mask as a mask for the conductive filler with the backing member then placed against the non-mask side of the greensheet.

The conductive paste 16 is of a type, as described above, typically used in the forming of conductive vias and patterns in ceramic greensheet for purposes of making integrated circuits.

As shown in FIGS. 3 and 4, the conductive paste in hardened form tends to contract as the solvent vehicle and components thereof volatize and harden, thus forming depressions 18 in the exposed via surface.

It is depression 18 which one of the methods of the present invention minimizes by overprinting that exposed surface of the via with additional conductive paste 20 as shown in FIG. 4. As also shown in FIG. 4, a second overprint mask 22 may optionally be used so as to minimize the amount of conductive paste left on the in situ mask in the overprinting process. Alternatively, the second mask 22 may be avoided and the original in situ mask 12 may be used by screening the overprint paste 20 into the limited area of the via opening. In the later implementation, as shown in FIG. 5, upon removal of in situ mask 12, a relatively flat exposed surface of the via remains from the overprint paste 20.

In some cases, the slight protuberance of overprint paste 20 may itself be considered a defect-causing feature. In these instances, that protuberance may be minimized in accordance with another embodiment of the present invention by applying pressure thereto, such as from opposed platen surfaces 24 and 26, as shown in FIG. 6 or by laminating the greensheet with adjoining greensheet lamina which apply pressure and flatten the remaining via protuberance in much the same way as opposing platens 24 and 26. In the latter case, i.e. when the surface protuberance is flatted by contact with an adjoining lamina, filing of surface depression by the secondary 3application of additional conductive paste (as shown in FIG. 4) may be avoided entirely.

Referring then to the sequential views of FIGS. 1–6 collectively, the method of the present invention comprises applying an in situ mask 12 to greensheet 10 (FIG. 1), punching a via opening 10a (FIG. 2) therethrough, applying a backing member 14 over the in situ mask 12 and then filling the via with a first application of a conductive paste 16. The conductive paste 16 hardens typically with the formation of a depression 18 at the exposed via surface surrounded by the in situ mask 12 (FIG. 3). This depression 18 is then filled by the application of a second overprint conductive paste 20 which may be screened onto the limited area of the exposed via surface or masked onto that exposed area by a second mask 22 (FIG. 4). In some cases, removal of the in situ mask 12, leaves a slight protuberance of overprint paste (FIG. 5) which is then leveled back into conformance with the surrounding surface of the ceramic greensheet by the application of pressure, such as by opposing platens 24 and 26 on the two sides of the ceramic greensheet, at least in the area of the via opening (FIG. 6).

Alternatively, protuberances from a via opening, as seen above and below greensheet 10 in FIG. 6 (which lay in planes vacated by the in-situ mask and by filler masks 16a and which correspond generally to the thickness of those masks) may be flattened to the level of the surrounding greensheet (or planarized), even without the second conductive paste application, by applying pressure through opposing platens 24 and 26 in FIG. 6, or by adjoining lamina, so as to prepare a substantially flat via surface for presentation to an adjoining greensheet circuit element.

Although not shown in any of the foregoing figures, the X-Y circuitry or "personalization" of the greensheets shown in these figures would typically lie in the plane of the overhanging shoulders of via filler 16 seen, for example, in FIG. 3. Thus, mask 16a as shown in FIG. 3 may be a metal mask with circuitry elements or a lead line connecting with the via opening 10a so that the filling of via opening 10a may be accomplished in conjunction with the screening of the circuitry pattern in the stage represented by FIG. 3 of the foregoing sequence. Such a lead wire connection might appear, for example, simply as an extension of one or both of the top overhangs of conductive paste 16 in via hole 10a, as seen in FIG. 3.

Upon formation of the X-Y circuitry or conductive elements and the simultaneous filling of the via openings, the various lamina are laminated into a single component and fired, typically to a temperatures greater than 1500° C. This produces some shrinkage as organic constituents are removed from the laminate and, with a certain amount of design shrinkage, a final sintered component. This final sintered component comprises a multiplicity of integrated circuits all interconnected.

Although illustrated and described herein with reference to certain specific embodiments, the present invention is nevertheless not intended to limited to the details shown. Rather, various modifications may be made in the details within the scope and range of equivalents of the claims and without departing from the spirit of the invention.

What is claimed:

1. A method for forming conductive vias in ceramic greensheet comprising:

adhering to said greensheet an in situ mask on one side thereof;

punching a via opening through said greensheet and said mask;

covering said via opening on said one side of said greensheet with a backing material;

filling said via opening with a conductive paste from the other side of said greensheet;

permitting said conductive paste to harden, wherein a depression remains in a surface of the hardened paste exposed on the in situ mask side of said greensheet;

filling said depression in the surface of said hardened paste exposed on the in situ mask side of said greensheet by applying to said exposed hardened paste surface an additional conductive paste; and removing said in situ mask.

2. The method, as recited in claim 1, wherein a second mask, with via openings slightly larger than that of said in situ mask, is placed over said in situ mask, before said additional conductive paste is applied to said exposed hardened paste surface, and said second mask is removed thereafter.

3. The method, as recited in claim 1 wherein, following removal of said in situ mask, a via protuberance comprising residual conductive paste protrudes above the level of the surrounding surface in the plane vacated by the in situ mask and said via protuberance is leveled by applying pressure thereto with a platen member.

4. A method for forming conductive vias in ceramic greensheet comprising:

covering said greensheet with an in situ mask on one side thereof;

punching a via opening through said greensheet and said mask;

covering said via opening on the side of said greensheet opposite said one side with a backing material;

filling said via opening with a conductive paste from the in-situ mask side of said greensheet, using the in situ mask as a mask therefor;

removing said in situ mask, leaving a conductive paste protuberance above the level of the surrounding surface in the plane vacated by the in situ mask;

applying pressure to flatten said protuberance; and then overlaying a circuit pattern mask on the in situ mask side.

5. A method for forming conductive vias in ceramic greensheet comprising:

covering said greensheet with an in situ mask on one side thereof;

punching at least one via opening through said greensheet and said in situ mask;

overlaying the in situ mask side of said greensheet with a backing member and the other side of the greensheet with a circuit pattern mask including openings in the areas of said via openings and in preselected areas intended as circuit conductors;

filling said circuit pattern mask openings including said via opening with a conductive paste;

removing said backing member and said circuit pattern mask;

permitting said conductive paste to harden, wherein a depression remains in a surface of the hardened paste exposed on the in situ mask side of said greensheet;

filling said depression in the surface of said hardened paste exposed on the in situ mask side of said greensheet by applying to said exposed hardened paste surface additional conductive paste; and removing said in situ mask.

6. The method, as recited in claim 5, further comprising:

placing a second mask, with via openings slightly larger than that of said in situ mask, over said in situ mask before said additional conductive paste is applied to said exposed hardened paste surface;

removing said second mask thereafter prior to hardening of said additional conductive paste; and then removing said in situ mask prior to hardening of said additional conductive paste.

7. The method, as recited in claim 5, wherein said greensheet is 0.025–0.625 mm thick and said via openings are 0.05–0.50 mm in diameter.

8. The method, as recited in claim 7, wherein said conductive paste comprises a composition of conductive metal particles in an organic binder together with an organic solvent vehicle.

9. The method, as recited in claim 8, wherein said metal particles are selected form the group consisting of molybdenum, tungsten, copper and silver and combinations thereof, and said organic binder comprises ethylcellulose and said solvent comprises butyl carbitol acetate.

10. The method, as recited in claim 9, wherein said conductive paste also includes a ceramic filler material.

* * * * *